United States Patent
Giacomini et al.

(10) Patent No.: US 9,927,907 B2
(45) Date of Patent: Mar. 27, 2018

(54) METHOD AND APPARATUS FOR OPERATING A TOUCH INPUT DEVICE, A LIGHTING DEVICE, AND A CIRCUIT

(71) Applicant: WHIRLPOOL CORPORATION, Benton Harbor, MI (US)

(72) Inventors: Neomar Giacomini, Benton Harbor, MI (US); Brian N. Radford, Stevensville, MI (US); Peter J. Melsa, Niles, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 174 days.

(21) Appl. No.: 14/878,551

(22) Filed: Oct. 8, 2015

(65) Prior Publication Data

US 2016/0103551 A1 Apr. 14, 2016

Related U.S. Application Data

(60) Provisional application No. 62/062,198, filed on Oct. 10, 2014.

(51) Int. Cl.
*G06F 3/041* (2006.01)
*G06F 3/042* (2006.01)
*H03K 17/96* (2006.01)

(52) U.S. Cl.
CPC .......... *G06F 3/0416* (2013.01); *G06F 3/0421* (2013.01); *H03K 17/96* (2013.01); *H03K 2217/960785* (2013.01)

(58) Field of Classification Search
CPC ..... G06F 3/0416; G06F 3/0421; H03K 17/96; H03K 2217/960785
See application file for complete search history.

(56) References Cited

U.S. PATENT DOCUMENTS

| | | | |
|---|---|---|---|
| 2011/0050626 A1* | 3/2011 | Porter | H03K 17/952 345/174 |
| 2011/0055703 A1* | 3/2011 | Lundback | H04R 27/00 715/727 |
| 2012/0280936 A1* | 11/2012 | Wang | G06F 3/044 345/174 |
| 2017/0017340 A1* | 1/2017 | Liu | G06F 3/0416 |
| 2017/0153742 A1* | 6/2017 | Pang | G06F 3/0416 |

* cited by examiner

*Primary Examiner* — Ricardo L Osorio

(57) ABSTRACT

A method and apparatus for operating a touch input device and a lighting device coupled with a circuit, includes generating, in a signal combiner, an operational signal configured to identify a touch input device state for the touch input device, interpreting, in a touch core module, the identified touch input device state for the touch input device, in response to the interpreting of the touch input device state, generating, in a light core module, a lighting device state for the lighting device, providing the operational signal and the lighting device state, and controlling the touch input device and the lighting device via the operational signal and the lighting device state.

20 Claims, 5 Drawing Sheets

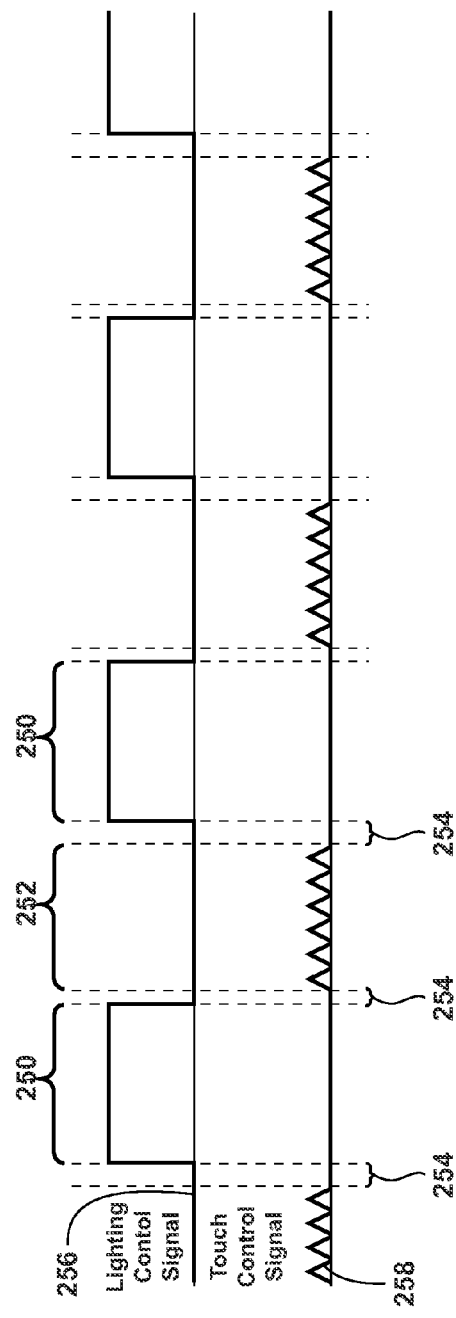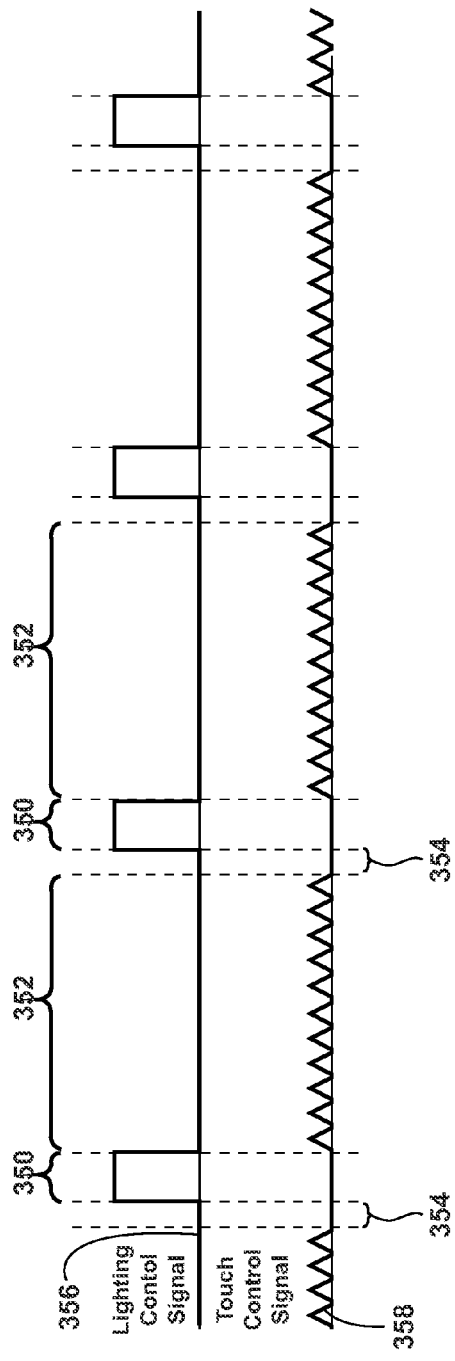

METHOD AND APPARATUS FOR OPERATING A TOUCH INPUT DEVICE, A LIGHTING DEVICE, AND A CIRCUIT

CROSS-REFERENCE TO RELATED APPLICATIONS

The present application claims the benefit of U.S. Provisional Patent Application No. 62/062,198, filed Oct. 10, 2014, which is incorporated by reference herein in its entirety.

BACKGROUND OF THE INVENTION

Circuits that support illuminated touch sensitive areas are configured to support both a touch input device for receiving a touch device input signal and a lighting device or light source for generating light at, about, or near the touch input device. The lighting device can be controllably operated to generate light, for example, in response to a user providing input to the touch input device, or in response to a controller controlling a cycle of operation. One example of a device that can utilize an illuminated touch sensitive area can include an appliance.

Conventional circuits that support the touch input device and the lighting device use a first printed circuit board (PCB) trace or input/output lead for the touch input signals associated with the touch input device, and a second trace or output lead for driving or powering the lighting device. Both traces can be routed to substantially the same PCB location, that is, each trace can be independently coupled with a PCB component, such as a controller.

BRIEF DESCRIPTION OF THE INVENTION

In one aspect, a circuit includes a common signal path, a signal combiner module connected to the common signal path and responsive to signals communicated via the common signal path, a touch core module connected to the signal combiner module and configured to interpret a state of a touch input device coupled with the common signal path, and a light core module connected to the signal combiner module and to the touch core module, and configured to generate a lighting device state for a lighting device coupled with the common lead. Operations of the touch input device and the lighting device are controlled via the signal combiner module and the common signal path.

In another aspect, an appliance, includes a touch input device, a lighting device, and a controller. The controller further includes a common signal path coupled with the touch input device and the lighting device, a signal combiner module connected to the common signal path and responsive to signals communicated via the common signal path, a touch core module connected to the signal combiner module and configured to interpret a state of the touch input device, and a light core module connected to the signal combiner module and to the touch core module, and configured to generate a lighting device state for the lighting device. Operations of the touch input device and the lighting device are controlled via the signal combiner module and the common signal path.

In yet another aspect, a method of operating a touch input device and a lighting device coupled with a common signal path of a controller, the method includes generating, in a signal combiner, an operational signal configured to identify a touch input device state for the touch input device, interpreting, in a touch core module, the identified touch input device state for the touch input device, in response to the interpreting of the touch input device state, generating, in a light core module, a lighting device state for the lighting device, providing the operational signal and the lighting device state to the signal combiner, combining, in the signal combiner, the operational signal for operating the touch input device and the generated lighting device state into a common control signal at the common signal path, and controlling the touch input device and the lighting device via the signal combiner module and the common control signal at a common signal path.

BRIEF DESCRIPTION OF THE DRAWINGS

In the drawings:

FIG. 8 illustrates an alternative example control signal of the controller of FIG. 6.

FIG. 9 illustrates yet another alternative example control signal of the controller of FIG. 6.

DESCRIPTION OF EMBODIMENTS OF THE INVENTION

Embodiments of the disclosure can be implemented in any environment, apparatus, or method for managing, controlling, or operating a user interface input device, such as a button or a touch input device, and a light emitting device, such as an incandescent light, a light emitting diode (LED), or the like. While LED is used to describe the lighting device or light emitting device, embodiments of the disclosure can include any type of light emitting device. The lighting devices can be configured for generating light at, about, or near the touch input device. The lighting device can be controllably operated to generate light, for example, in response to a user providing input to the touch input device, or in response to a controller controlling a cycle of operation.

The touch input device can be operated using capacitive, resistive, or electrical means for registering a user's input on the input device. Embodiments of the disclosure can further be included with, or integrated with an appliance, such as a household appliance. Non-limiting examples of appliances can include a laundry treating appliance, washer, dryer, refrigerator, trash compactor, microwave, stove, cooking devices, dishwasher, or the like.

Figure 1:
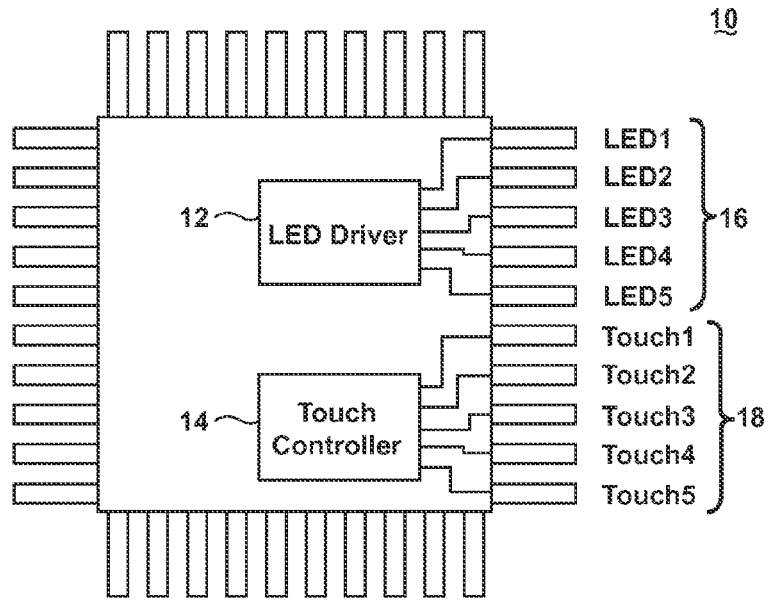
FIG. 1 is a schematic view of a prior art controller configured to support an illuminated touch sensitive area.

FIG. 1 illustrates a prior art controller 10 configured to support an illuminated touch sensitive area. As shown, the controller 10 can include an LED driver 12 and a touch controller 14, wherein the LED driver 12 is communicatively or electrically coupled with a first set of output leads 16 and the touch controller 14 is similarly communicatively or electrically coupled with a second set of output leads 18. While not shown, the first set of output leads 16 can be connected with one or more lighting devices and the second set of output leads 18 can be connected with one or more touch input devices. In this sense, the first set of output leads 16 are configured to controllably drive, operate, or power the one or more lighting devices (e.g. controllable operated to generate light) and the second set of output leads 18 are configured to controllably drive, operate, or power the one or more touch input devices. Additionally, while the first and second sets of leads 16, 18 are described as "output" leads, embodiments of the disclosure can include input/output leads, that is, connections that provide and receive power, data, communications, control, or the like. Touch integrated circuits (ICs) and LED drivers, like that shown in FIG. 1, can be implemented by separate ICs, or when integrated they require separate pins on an IC to implement both functionalities, such as the first set of output leads 16 and the second set of output leads 18.

Examples of the disclosure described herein can combine touch input signals and LED drive signals on a single PCB trace and/or at a single IC pin. In some examples, an IC implements an LED drive circuit and a touch core that share the same external IC pin. The touch core receives touch input signals associated with an illuminated touch area on an IC pin simultaneous with the LED drive circuit outputting LED drive signals associated with that illuminated touch area on the same IC pin.

Figure 2:
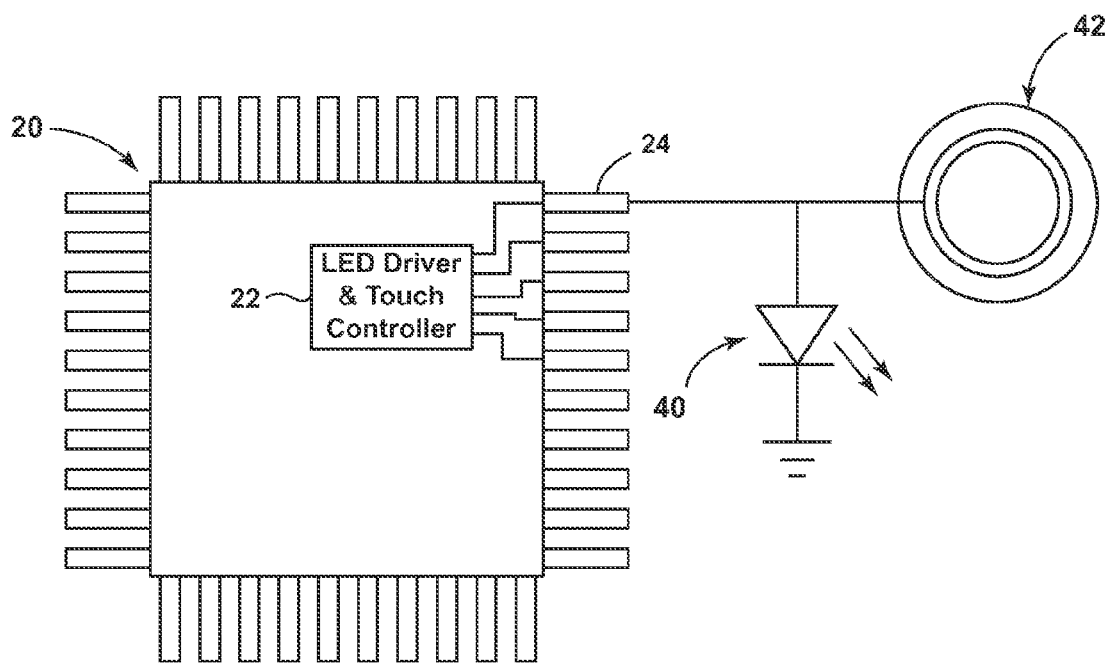
FIG. 2 is an example schematic view of a controller connected with a touch input device and a lighting device.

FIG. 2 illustrates one embodiment of the disclosure, including a controller 20 having a combination LED driver and touch controller 22, connected with and controllably driving, operating, or powering one or more common leads 24, illustrated as a set of common leads 24. While a common lead 24 is described, embodiments of the disclosure can include wherein a common lead 24 includes a common signal path, that is, a common communication or discrete data path, such as used in an integrated circuit (IC). As shown, a single common lead 24 can be coupled with a touch input device 42 and a lighting device 40, shown as a LED, configured in parallel. In this sense, a lighting device 40 and a touch input device 42 coupled with a single common lead 24 can be controllable by the combination LED driver and touch controller 22 of the controller 20. As before, each common lead 24 can include an input/output common lead 24, that is, a connection that provides and receives power, data, communications, control, or the like.

Figure 3:
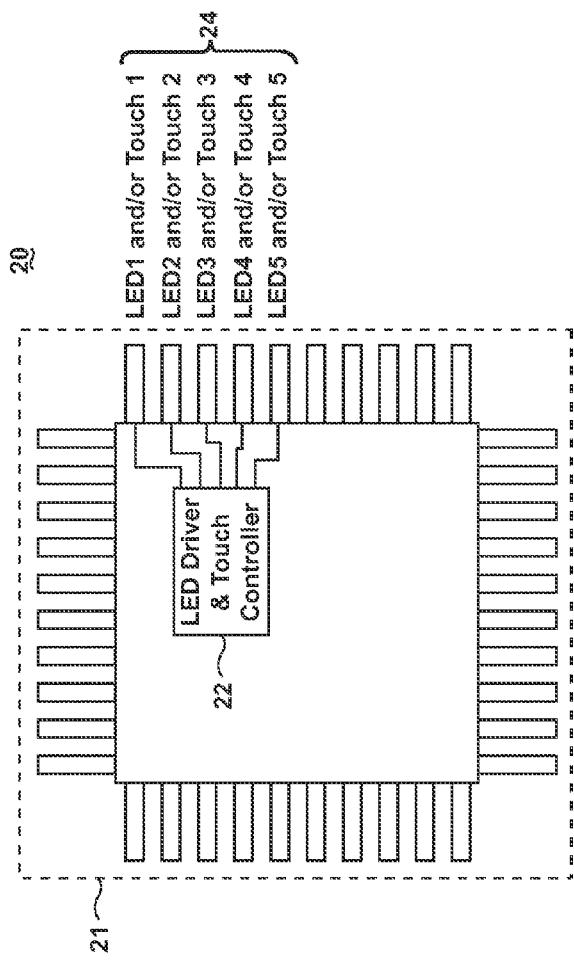
FIG. 3 is a schematic view of a controller in accordance with embodiments of the disclosure.

FIG. 3 is a schematic diagram of the controller 20 of FIG. 2, illustrating one example implementation the LED driver and touch controller 22, and the set of common leads 24, without a touch input device 42 or lighting device 40 coupled with a common lead 24. FIG. 3 also schematically illustrates that the controller 20 can be included as part of an appliance 21, such as a household appliance, as described above. While the controller 20 is shown within the appliance 21, alternative embodiments of the disclosure can include locating the controller 20 near, about, or remote to the appliance 21.

Figure 4:
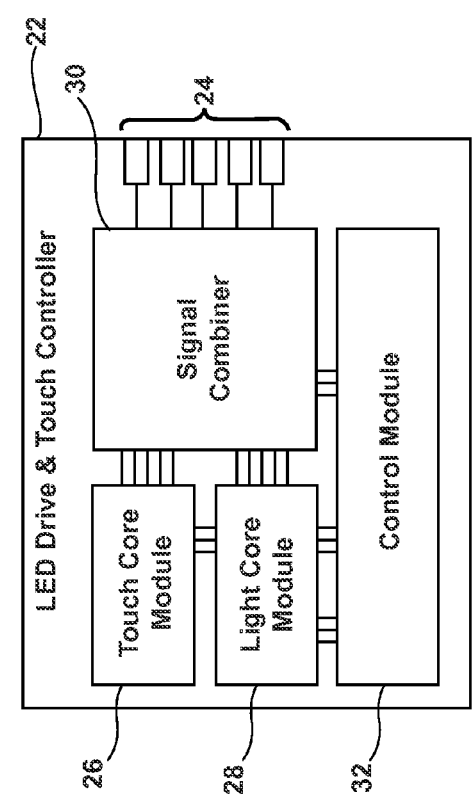
FIG. 4 is a schematic view of the controller of FIG. 3.

FIG. 4 is a schematic block diagram illustrating an example manner of implementing the example IC or controller 22 of FIG. 3. The controller 22 can include a touch core module 26, a light core module 28, a signal combiner module 30, and an optional control module 32. The touch core module 26 can be connected with the signal combiner module 30, the light core module 28, and the control module 32, and can be configured to both drive the operation of a touch input device 42 coupled with the common lead 24 and interpret one or more states of the touch input device 42, such as when a user is touching or activating at least a portion of the touch input device 42. While the touch input is described as a user touching the touch input device 42, embodiments of the disclosure can include types of various touches, such as a sliding motion, taps, patterns, and the like, and can further include touching performed by non-human or inanimate elements, such as a stylus pen, or a stick. Additionally, the touch core module 28 can further be configured to drive the operation of the touch input device 42, and interpret one or more states of the touch input device 42 by way of sending or receiving intermediary signals representative of, respectively, a touch input device control signal or a touch input interpretation signal. Stated another way, the touch control module 26 can be configured to operate and interpret touch input device signals that are different from, representative of, or related to the actual touch input device signals provided to and received by the touch input device 42 on the common lead 24.

The light core module 28 is also connected with the signal combiner module 30 and the controller module 28, and can be configured to generate a lighting device state for a lighting device 40 coupled with the common lead 24. The light core module 28 can further be configured to drive the operation of the lighting device 40 by way of sending intermediary signals representative of a lighting device control or power signal. Stated another way, the light device module 26 can be configured to operate lighting device signals that are different from, representative of, or related to the actual lighting device signals provided to the lighting device 40 on the common lead 24.

The signal combiner module 30 can be connected with the common lead 24 and the controller module 32, and can be configured to provide or generate, for example, simultaneous operational control, or a common operational signal or output signal, to the touch input device 42 and the lighting device 40 connected with the common lead 24. In one example, the signal combiner module 30 is configured to provide operational controls to the touch input device 42 and the lighting device 40 by combining the individual control signals, or representations thereof, provided to the signal combiner module 30 by the touch core module 26 or the light core module 28. The signal combiner module 30 can further be configured to receive, interpret, identify, or otherwise be responsive to signals communicated via the common lead 24, such as signals indicating touch input has been entered or received by the touch input device 42. The signal combiner module 30 can be additionally configured to receive and convert, translate, or otherwise generate a control signal to control operations of the touch input device 42 or the lighting device 40, wherein the control signal is delivered to the common lead 24 and based on at least one of the touch core module 26 signals or light core module 28 signals provided to the signal combiner module 30.

The optional control module 32 can include a control unit configured to control overall operation of at least one of the touch core module 26, light core module 28, or signal combiner module 30. For example, the control module 32 can include a processor configured to execute a set of computer instructions or computer code to perform one or more operations for a device or appliance. In this sense, the touch core module 26, the light core module 28, or the signal combiner module 30 can communicate current operational states of, for example, the touch input device 42 or lighting device 40, and the control module 32, in response to the current operating state of the devices, or in response to a current operation or program execution, can direct the touch core module 26, light control module 28, or signal combiner module 30 to perform a particular operation. Particular operations can include a particular user-selectable option or operation mode wherein the lighting device 40 highlights a "pots and pans" selection on a dishwasher as selectable or previously selected, or the unavailability of rinse cycle when an extra spin cycle has been selected in a laundry treating appliance. Stated another way, the control module 32 can include or control what functionality of the touch input device 42 or the lighting device 40 is selected and/or running at a particular moment.

In the example of FIG. 4, the control module 32 controls the touch core module 26 and the light core module 28 to work in partnership with a signal combiner module 30 to implement both touch inputs and LED drive outputs on the same pin or common lead 24.

The signal combiner can combines the operational control signal for the touch input device 42 (from the touch core module 26) and the operational control signal for the lighting device 40 (from the light core module 28) using any number and/or type(s) of methods, techniques, circuits, or the like. In non-limiting examples, the signal combiner module 30 can combine a touch signal and an LED drive signal using signal modulation such as, for example amplitude modulation (AM), pulse width modulation (PWM), frequency modulation (FM), which may be useful given the frequency burst nature of capacitive touch charge and discharge.

Figure 5:
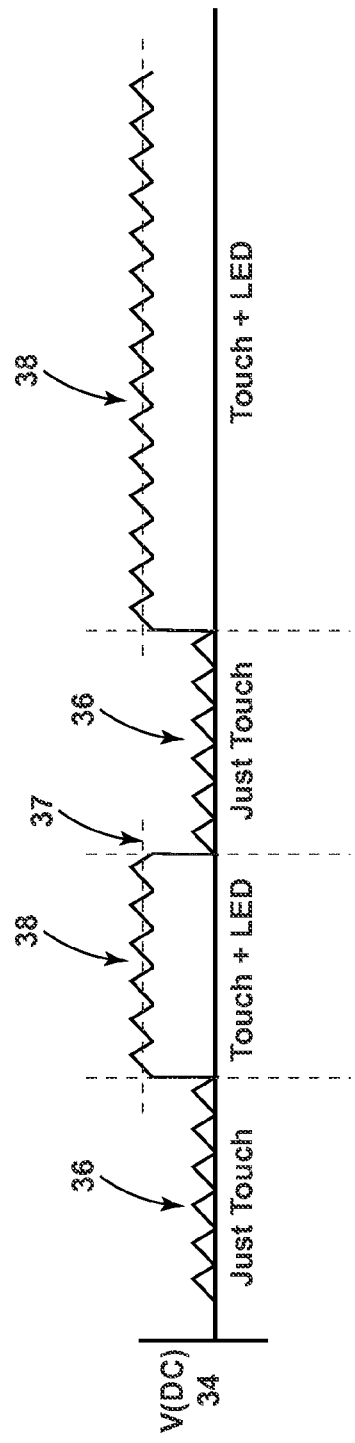
FIG. 5 illustrates an example control signal of the controller of FIG. 4.

FIG. 5 illustrates an example control signal that could be generated by the signal combiner module 30 and provided to a common lead 24 that carries both touch input and LED driver output. The graph of FIG. 5 is intended for purposes of explanation, in practical implementations measured waveform shape(s) may differ from those shown, and amplitudes, durations, slopes, and/or times are not drawn to scale. In FIG. 5, a capacitive touch sensing charging and discharging signal 36 can be generated by a varying direct current (DC) voltage 34, wherein the charging and discharging signal 36 is utilized or received by the touch input device 42, and configured to detect touches on at least a portion of a user interface panel. The charging and discharging signal 36 can both be provided to the touch input device 42, and a change or difference in the charging and discharging signal 36 can indicate, represent, or demonstrate a touch has occurred. The charging and discharging signal 36 only represents a period of time wherein the signal combiner module 30 is providing a control signal to the touch input device 42.

A second control signal 38 is further illustrated that demonstrates the charging and discharging signal 36 is combined with a DC voltage that is generated or configured to drive or illuminate the lighting device 40 in addition to providing operational control or receiving touch inputs from the touch input device 42. In this example, the increase in DC voltage during the period of the second control signal 38 is an amplified configuration of the charging and discharging signal 36, wherein the increased amplitude or increased voltage is used to drive (or consumed by) the lighting device 40. While the charging and discharging signal 36 utilized by the touch input device 42 is illustrated as a saw shaped signal, which results from capacitor charging and discharging, additional or alternative touch signals having other shapes, amplitudes and/or timings may be used.

The signal combiner module 30, can thus be configured to combine the saw shaped touch signal of the charging and discharging signal 36 with the increased DC voltage signal to provide the common lead 24 control signal for at least one of the touch input device 42 or the lighting device 40. While FIG. 5 appears to demonstrate that the lighting device 40 or can be intermittently active, embodiments of the disclosure are included wherein, for example, the lighting device 40 is active while the touch input device 42 is not. Additionally, embodiments of the disclosure are included wherein at least one of the touch input device 42 or the lighting device 40 are active with different duty cycles than that shown in FIG. 5, including both or neither device being always active.

Moreover, embodiments of the disclosure are included wherein, for example, the light core module 28 can be configured to provide the increased DC voltage signal to the signal combiner module 30 for combination, or wherein the light core module 28 can provide a second signal indicative of an "on" or illuminated state to the signal combiner module 30, and wherein the signal combiner module 30 provides the increased DC voltage signal in response to the signal provided by the light core module 28. Similarly, the touch core module 26 can be configured to provide the charging and discharging signal 26 to the signal combiner module 30 for combination, or wherein the touch core module 26 can provide a first signal indicative of, or representative of, an "on" or "ready to receive touch input" state to the signal combiner module 30, and wherein the signal combiner module 30 provides the charging and discharging signal 26 in response to the signal provided by the touch core module 26. Additionally, dotted line 37 can indicate the average DC voltage level applied to drive the lighting device 40, however additional configurations can be included.

Additionally, in embodiments of the disclosure where the optional control module 32 is included, the control module 32 can provide or control the signal combiner module 30 to include or control compensations between the control signal for the touch input device 42 and the control signal for the lighting device 40.

Figure 6:
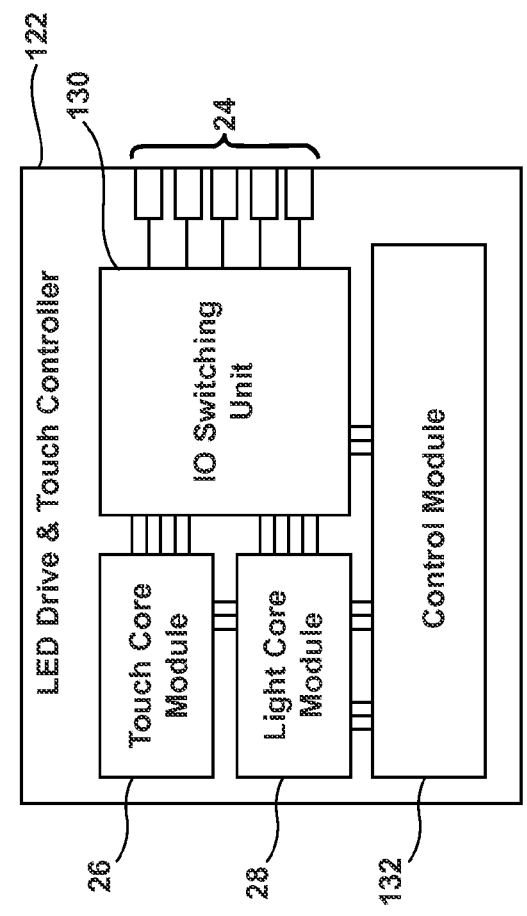
FIG. 6 is a schematic view of a controller according to a second embodiment of the disclosure.

FIG. 6 is a schematic block diagram illustrating a second example embodiment or implementation of the controller 122 of FIG. 2. The second embodiment is similar to the first embodiment; therefore, like parts will be identified with like numerals increased by 100, with it being understood that the description of the like parts of the first embodiment applies to the second embodiment, unless otherwise noted. A difference between the first embodiment and the second embodiment is that the signal combiner module can include an input/output (IO) switching unit 130. The IO switching unit 130 can be configured to time multiplex (TM) the touch control signal and the lighting control signal on the same IC pin, trace, or common lead 24 of the controller 122. Additionally, a second control module 132 can be included to, for example, provide control for the IO switching unit 130 in operating the multiplexer, controlling the compensations between the touch control signal and the lighting control signal, or the like.

In the second embodiment, the touch control signal and the lighting control signal are not simultaneously actuated, as in the example of FIG. 5. Instead, they are alternately, sequentially, or otherwise time-multiplexed. That is, the lighting control signal has control of the common lead 24 during a first period of time, then the touch control signal has control of the common lead 24 during a subsequent second period of time, then the light core module signal has control of the IC pin during a subsequent third period of time, etc.

Figure 7:
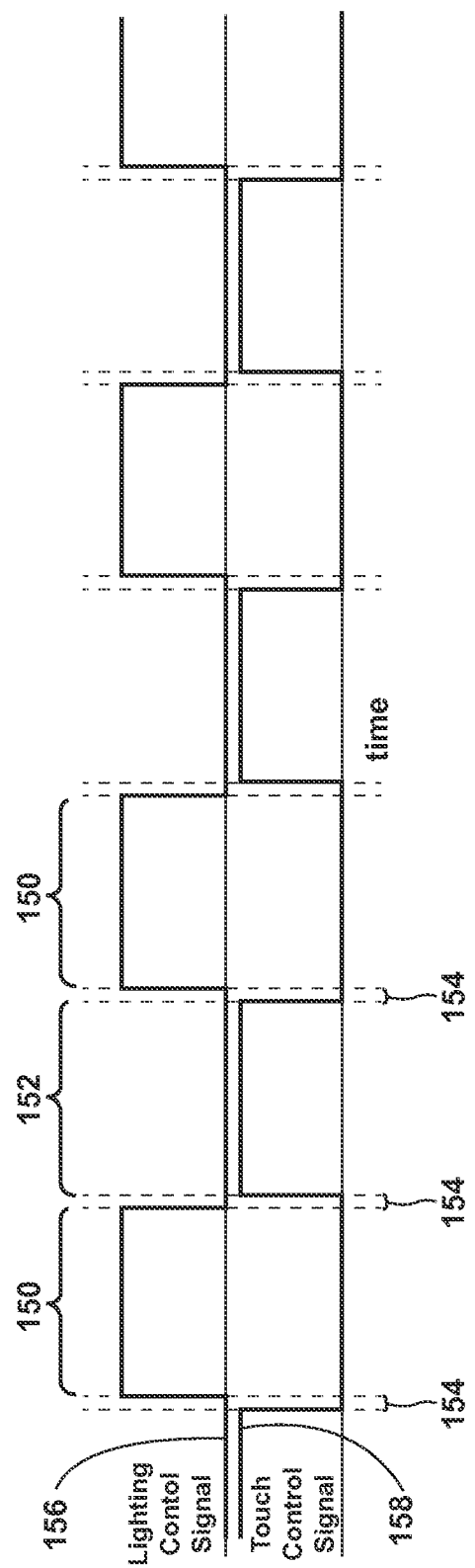
FIG. 7 illustrates an example control signal of the controller of FIG. 6.

FIG. 7 illustrates a non-limiting example of the time-multiplexed signal generated by the IO switching unit 130. As shown, the light core module 28 or IO switching unit 130 operates to drive the lighting device 40 via a lighting control signal 156 during a first period of time 150, while the touch core module 26 or IO switching unit 130 operates to drive the touch input device 42 via a touch control signal 158 during a second period of time 152. As illustrated in the example, the signal 156, 158 having the "high" signal is the controlling signal 156, 158 at any given time. Embodiments of the disclosure can include a third period of time 154, wherein no controlling signal occurs or is generated by the IO switching unit 130, or wherein the controlling signals can be spaced apart to, for example, accommodate transient signals. This third period of time 154 can occur, for example, to ensure there is no overlap between the controlling signals from the lighting or touch control signals 156, 158. Additionally, FIG. 7 is intended to illustrate the time-multiplexed control between the lighting and touch control signals 156, 158.

The touch control signal 158 and the lighting control signal 156 can be multiplexed with different duty cycles depending on, for example, differences between practical implementations.

FIG. 8 illustrates an alternative time-multiplexed signal generated by the IO switching unit 130, wherein touch control signal 258 operates to drive the touch input device 42 via a charging and discharging signal, in between the lighting control signal 256 control of the first period of time 250 and the third period of time 254. FIG. 9 illustrates an alternative time-multiplexed signal generated by the IO switching unit 130, similar to the graph of FIG. 8, but wherein the duty cycle of the lighting control signal 356 is shorter during the first period of time 350, while both the duty cycle of the touch control signal 358 during the second period of time 352, and the third period of time 354, are each longer. In some examples, the time multiplexing of the touch control signal 358 and the lighting control signal 356 may be implemented using pulse-width modulation (PWM) or by way of time-multiplexed encoding of applicable signals. The graphs of FIG. 7-9 are intended for purposes of explanation, in practical implementations measured waveform shape(s) may differ from those shown, and amplitudes, durations, slopes, or times are not drawn to scale.

Embodiments of the disclosure thus include a controller having a common lead output or input/output, which controllably operates a touch input device and a lighting device via a common output control signal, using the same physical external pin of the controller. While in the examples disclosed herein, touch input control signals and lighting control signals are combined into a single signal or onto the same pin, circuits implementing the examples disclosed herein may additionally implement touch signals and LED drive signals on separate pins, separate traces, or separate leads. Additionally or alternatively, a touch control signal and a lighting control signal combined onto a single pin, trace, or lead can be electrically coupled to different areas of a user interface. For example, the combined control signal could be routed to both a non-illuminated touch area, and to an illuminated non-touch area.

Many other possible embodiments and configurations in addition to that shown in the above figures are contemplated by the present disclosure.

The embodiments disclosed herein provide a controller and method for operating a touch input device and a lighting device coupled with a common lead of the controller. One advantage that can be realized in the above embodiments is that the above described embodiments can include operating a touch input device and a lighting device utilizing limited signals, outputs, leads, or the like, from a controller. Utilizing fewer outputs results in correspondingly fewer connections, wires, printed circuit board conductive pathways, etc. ultimately routing or coupling the controller with the touch input device or the lighting device. In embodiment of the disclosure wherein the touch input device or lighting device are located remote from the controller, such as on a display panel, reduced or fewer connections can result in weight savings from reduced wiring and cost savings from reduced componentry. Additionally, fewer traces or outputs to route between the controller and the touch input device or the lighting device can result in simplified manufacturing processes, simplified circuit analysis, and printed circuit board surface area needed to accomplish the same levels and amount of control over the systems.

To the extent not already described, the different features and structures of the various embodiments can be used in combination with each other as desired. That one feature cannot be illustrated in all of the embodiments is not meant to be construed that it cannot be, but is done for brevity of description. Thus, the various features of the different embodiments can be mixed and matched as desired to form new embodiments, whether or not the new embodiments are expressly described. Moreover, while "a set of" various elements have been described, it will be understood that "a set" can include any number of the respective elements, including only one element. Combinations or permutations of features described herein are covered by this disclosure.

This written description uses examples to disclose embodiments of the invention, and also to enable any person skilled in the art to practice embodiments of the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A circuit, comprising:
  a common signal path;
  a signal combiner module connected to the common signal path and responsive to signals communicated via the common signal path;
  a touch core module connected to the signal combiner module and configured to interpret a state of a touch input device coupled with the common signal path; and
  a light core module connected to the signal combiner module and to the touch core module, and configured to generate a lighting device state for a lighting device coupled with the common signal path;
  wherein operations of the touch input device and the lighting device are controlled via the signal combiner module and the common signal path.

2. The circuit of claim 1, further comprising a control module connected with the touch core module and the light core module, and configured to control the generation of the lighting device state by the light core module.

3. The circuit of claim 2 wherein the control module receives the interpreted state of the touch input device from the touch core module.

4. The circuit of claim 3 wherein the control module is further configured to control the generation of the lighting device state in response to the interpreted state of the touch input device.

5. The circuit of claim 2 wherein the control module is further connected to the signal combiner module.

6. The circuit of claim 1 wherein the common signal path is an input/output signal path that is configured to receive a touch input device signal from the touch input device and provide the lighting device state for the lighting device.

7. The circuit of claim 1, further comprising a controller module.

8. The circuit of claim 1 wherein the signal combiner module is configured to at least partially generate a common output signal on the common signal path, wherein the common output signal is based at least in part on a first signal representative of the touch input device state and a second signal representative of the lighting device state.

9. The circuit of claim 8 wherein the common output signal is configured to drive both the touch input device and the lighting device simultaneously.

10. The circuit of claim 8 wherein the first signal is provided to the signal combiner by at least one of the touch core module or a controller module.

11. The circuit of claim 8 wherein the second signal is provided to the signal combiner by the other of the light core module or a controller module.

12. The circuit of claim 8 wherein the signal combiner module is configured to at least partially generate the common output signal by additively combining a third signal configured to drive the touch input device based on the first signal with a fourth signal configured to drive the lighting device based on the second signal.

13. The circuit of claim 8 wherein the signal combiner module is configured to at least partially generate the common output signal by encoding a first a third signal configured to drive the touch input device based on the first signal with a fourth signal configured to drive the lighting device based on the second signal.

14. The circuit of claim 8 wherein the signal combiner module is an input/output switching unit and is configured to at least partially generate a time-multiplexed common output signal wherein the signal combiner module generates a third signal configured to drive the touch input device based on the first signal during a first period of time, and generates a fourth signal configured to drive the lighting device based on the second signal during a second period of time.

15. An apparatus, comprising:
a touch input device;
a lighting device; and
a controller, comprising:
 a common signal path coupled with the touch input device and the lighting device;
 a signal combiner module connected to the common signal path and responsive to signals communicated via the common signal path;
 a touch core module connected to the signal combiner module and configured to interpret a state of the touch input device; and
 a light core module connected to the signal combiner module and to the touch core module, and configured to generate a lighting device state for the lighting device;
wherein operations of the touch input device and the lighting device are controlled via the signal combiner module and the common signal path.

16. The apparatus of claim 15 wherein the signal combiner module is configured to at least partially generate a common output signal on the common signal path, and the touch input device and the lighting device are configured to be driven or responsive to the common output signal.

17. A method of operating a touch input device and a lighting device coupled with a common signal path of a circuit, the method comprising:
generating, in a signal combiner, an operational signal configured to identify a touch input device state for the touch input device;
interpreting, in a touch core module, the identified touch input device state for the touch input device;
in response to the interpreting of the touch input device state, generating, in a light core module, a lighting device state for the lighting device;
providing the operational signal and the lighting device state to the signal combiner;
combining, in the signal combiner, the operational signal for operating the touch input device and the generated lighting device state into a common control signal at the common signal path; and
controlling the touch input device and the lighting device via the signal combiner and the common control signal at a common signal path.

18. The method of claim 17 further comprising providing the interpreted identified touch input device state to a controller module, and controlling, by the controller module, the generating of the lighting device state.

19. The method of claim 18 further comprising updating at least one of the touch input device state or the lighting device state, by the control module, in response to the interpreting of the touch input device state.

20. The method of claim 17 wherein the combining further includes at least one of additive signal combining or time-multiplexed signal combining of the operational signal for operating the touch input device and the generated lighting device state.

* * * * *